(12) United States Patent
Wu et al.

(10) Patent No.: US 12,087,578 B2
(45) Date of Patent: Sep. 10, 2024

(54) SEMICONDUCTOR STRUCTURE AND METHOD OF FORMING THE SAME

(71) Applicant: Taiwan Semiconductor Manufacturing Co., Ltd., Hsinchu (TW)

(72) Inventors: Chun-Hung Wu, New Taipei (TW); Chia-Cheng Chen, Hsinchu (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 140 days.

(21) Appl. No.: 17/651,851

(22) Filed: Feb. 21, 2022

(65) Prior Publication Data
US 2022/0406592 A1 Dec. 22, 2022

Related U.S. Application Data

(60) Provisional application No. 63/212,180, filed on Jun. 18, 2021.

(51) Int. Cl.
| | |
|---|---|
| *H01L 21/027* | (2006.01) |
| *H01L 21/311* | (2006.01) |
| *H01L 21/3213* | (2006.01) |

(52) U.S. Cl.
CPC .... *H01L 21/0273* (2013.01); *H01L 21/31144* (2013.01); *H01L 21/32139* (2013.01)

(58) Field of Classification Search
CPC .......... H01L 21/0273; H01L 21/31144; H01L 21/32139
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,184,054 B1 | 11/2015 | Huang et al. |
| 9,213,234 B2 | 12/2015 | Chang |
| 9,223,220 B2 | 12/2015 | Chang |
| 9,256,123 B2 | 2/2016 | Shih et al. |
| 9,256,133 B2 | 2/2016 | Chang |
| 9,529,268 B2 | 12/2016 | Chang et al. |

(Continued)

OTHER PUBLICATIONS

U.S. Appl. No. 17/463,000, filed Aug. 31, 2021.

*Primary Examiner* — Binh X Tran
(74) *Attorney, Agent, or Firm* — Slater Matsil, LLP (57) ABSTRACT

A method of forming a semiconductor device includes forming a photoresist over a target layer, where the target layer includes a substrate. The photoresist is patterned to form a patterned photoresist. Scum remains between portions of the patterned photoresist. The substrate is tilted relative to a direction of propagation of an ion beam. An ion treatment is performed on the scum. A pattern of the patterned photoresist is transferred to the target layer.

20 Claims, 10 Drawing Sheets

(56) References Cited

U.S. PATENT DOCUMENTS

| | | | |
|---|---|---|---|
| 9,536,759 B2 | 1/2017 | Yang et al. | |
| 9,548,303 B2 | 1/2017 | Lee et al. | |
| 10,494,715 B2* | 12/2019 | Agarwal | H01L 21/02263 |
| 10,978,301 B2 | 4/2021 | Chang et al. | |
| 11,776,810 B2 | 10/2023 | Chen et al. | |
| 2011/0272742 A1* | 11/2011 | Akiyama | H01L 29/41725 |
| | | | 257/E21.403 |
| 2019/0267246 A1* | 8/2019 | Bai | H01L 21/32136 |
| 2020/0144061 A1* | 5/2020 | Mignot | G03F 7/40 |

* cited by examiner

SEMICONDUCTOR STRUCTURE AND METHOD OF FORMING THE SAME

PRIORITY CLAIM AND CROSS-REFERENCE

This application claims the benefit of U.S. Provisional Application No. 63/212,180, filed on Jun. 18, 2021, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method are provided in accordance with some embodiments. For example, methods of reducing or removing scum on a patterned mask layer are provided. In some embodiments, scum may be removed/reduced by performing a ion treatments at an angle to a surface of the patterned mask layer. In some cases, some scum may remain after the ion treatments, in which case a etch process, such as a chemical plasma etch, may be performed on the mask layer and remaining scum. The ion treatment on the scum may increase the efficiency of the scum removal etch process, thereby reducing loss of material from the patterned mask layer. By reducing the loss of material from the patterned mask layer, the ion treatment may lead to a transfer of the pattern of the patterned mask layer to lower layers with reduced defects, which may produce smoother profiles of subsequently formed conductive features in a target layer, such as metal lines. Smoother profiles of the conductive features may decrease sheet resistance and thus improve device performance.

Figure 1A:
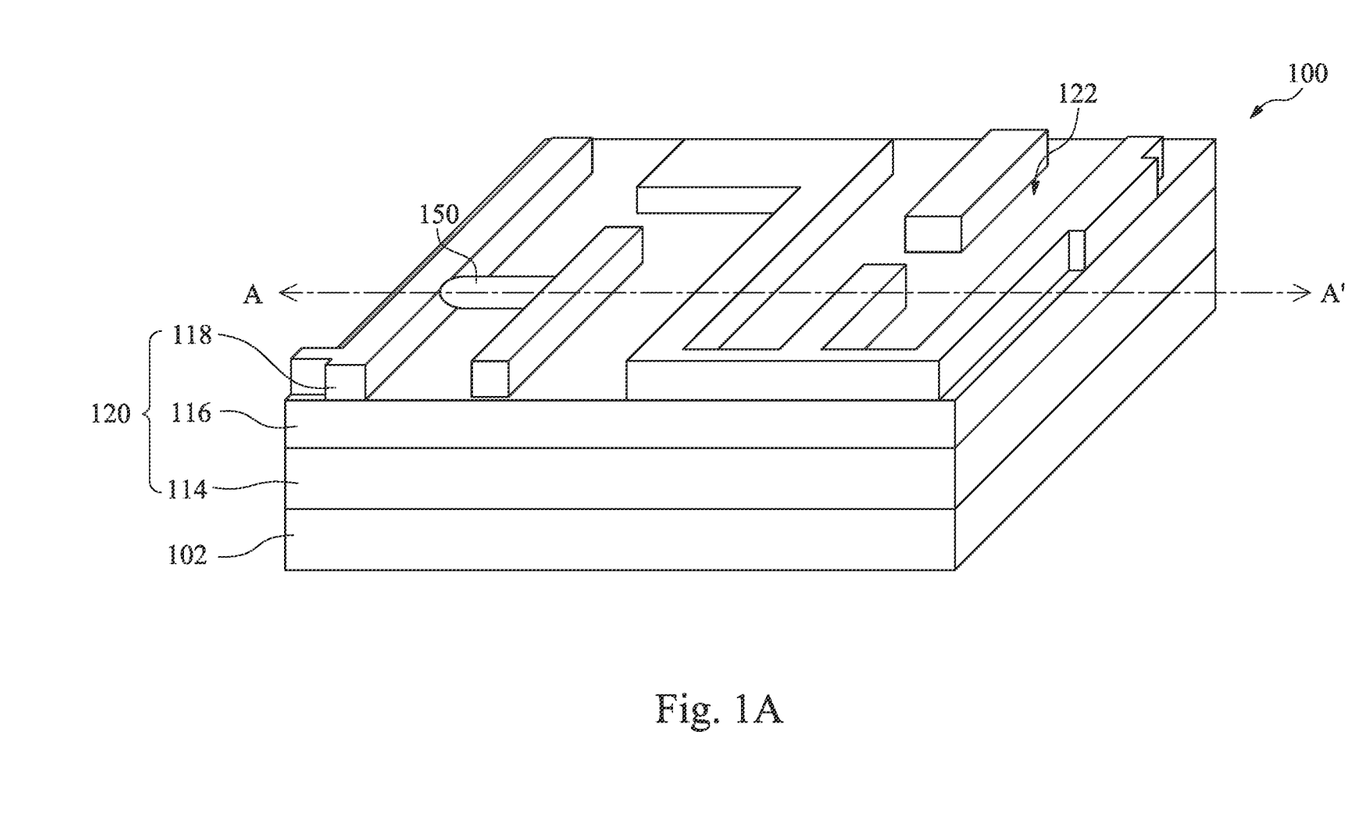
FIGS. 1A and 1B illustrate a perspective and a cross-sectional view, respectively, of an intermediary stage of manufacturing a semiconductor device in accordance with some embodiments.
Figure 1B:
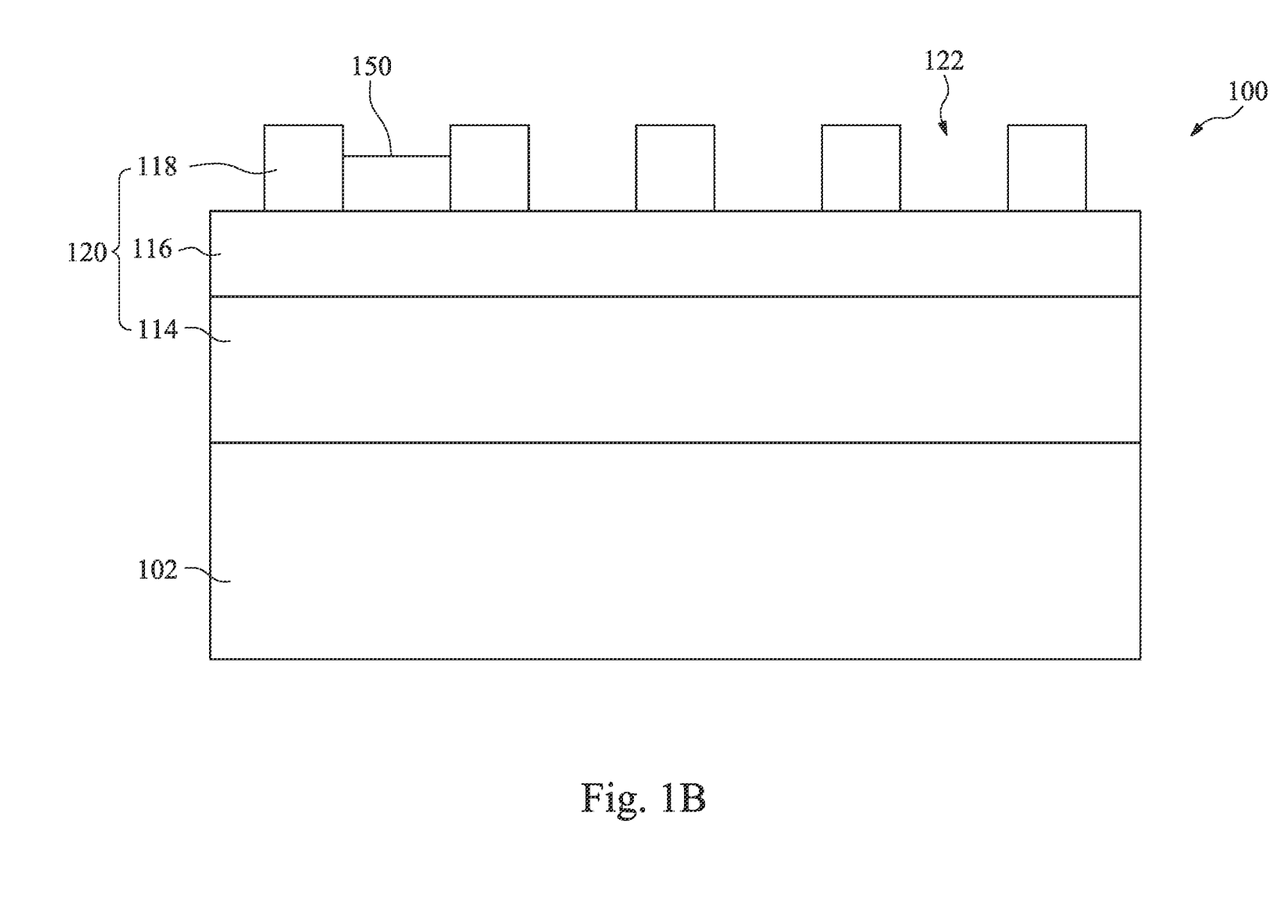

FIG. 1A illustrates a perspective view of an intermediate stage in the formation of features of a semiconductor device 100, in accordance with various embodiments, and FIG. 1B illustrates a cross-sectional view of FIG. 1A along line A-A'. As shown in FIG. 1A-B, a tri-layer mask 120 is formed over a target layer 102 in accordance with some embodiments. The target layer 102 represents a layer in which a plurality of patterns is to be formed. In some embodiments, semiconductor device 100 is processed as part of a larger wafer, such as a wafer 50 (see below, FIG. 2B). In such embodiments, after various features of the semiconductor device 100 is formed (e.g., active devices, interconnect structures, and the like), a singulation process may be applied to scribe line regions of the wafer 50 in order to separate individual semiconductor dies from the wafer 50 (also referred to as singulation).

As an example, the target layer 102 may be one or more of a semiconductor substrate with or without active/passive devices formed thereon, one or more dielectric layers (e.g., isolation regions, etch stop layers, interlayer dielectric (ILD) layers, inter-metal dielectric (IMD) layers, and/or the like), combinations thereof, or the like.

A pattern represented by the tri-layer mask 120 may represent, for example, trenches) to be formed and filled with insulating materials to form shallow trench isolation (STI) regions in the semiconductor substrate. In this manner, semiconductor fins may be formed protruding from between the formed STI regions and may be used to form semiconductor devices such as fin field effect transistors (FinFETs), or the like. As another example, the target layer 102 may be a semiconductor substrate having one or more nanosheets formed thereon, which may be subsequently patterned similar to the finFETs to form nanostructure field effect transistors (nano-FETs), or the like.

As another example, the target layer 102 may be an IMD layer over a semiconductor substrate. As discussed in greater detail below, openings or recesses may be patterned in the target layer 102, and conductive lines and/or vias may be formed in the openings or recesses.

As another example, the target layer 102 may be a conductive layer, such as a metal layer or a polysilicon layer, which is blanket deposited. Embodiment patterning processes may be applied to the target layer 102 in order to pattern semiconductor gates and/or dummy gates of transistors (e.g., finFETs, nano-FETs, or the like). By using embodiment processes to pattern a conductive target layer 102, spacing between adjacent gates may be reduced and gate density may be increased.

FIGS. 1A-1B further illustrates the tri-layer mask 120 (also referred to as a mask) formed over the target layer 102 in accordance with some embodiments. The tri-layer mask 120 represents a masking structure that will be patterned and act as an etching mask to pattern the target layer 102. Other masking structures may be used.

The tri-layer mask 120 includes a bottom layer 114, a middle layer 116 over the bottom layer 114, and an upper layer 118 over the middle layer 116. The bottom layer 114 and upper layer 118 may be formed of photoresists (e.g., photosensitive materials), which may include organic materials. In some embodiments, the bottom layer 114 may also act as a bottom anti-reflective coating (BARC) layer. The middle layer 116 may comprise an inorganic material, such as a nitride (such as silicon nitride), an oxynitride (such as silicon oxynitride), an oxide (such as silicon oxide), combinations of these or the like. The middle layer 116 may have a high etching selectivity relative to the upper layer 118 and the bottom layer 114. In some embodiments, the upper layer 118 is a photoresist material comprising carbon, hydrogen, oxygen, and/or metals such as antimony, zinc, hafnium, cobalt, palladium, the like, or a combination thereof. The various layers of the tri-layer mask 120 may be blanket deposited sequentially using, for example, spin-on processes. Other suitable deposition process may be used, such as CVD, ALD, PVD, or the like.

Although a tri-layer mask 120 is discussed for illustrative purposes, in some embodiments, the mask 120 may be a monolayer (e.g., comprising only the upper layer 118), a bilayer (e.g., comprising only the bottom layer 114 and the upper layer 118 without the middle layer 116) photoresist, or have additional masking layers. The type of mask and/or photoresist used (e.g., monolayer, bilayer, tri-layer, or the like) may depend on the photolithography process used to pattern the target layer 102.

The upper layer 118 is patterned using a photolithographic process, as discussed in greater detail below. Subsequently, the upper layer 118 is used as an etching mask for patterning of the middle layer 116 (see e.g., FIG. 4), and the middle layer 116 is then used as an etching mask for patterning of the bottom layer 114 (see e.g., FIG. 5). The bottom layer 114 is then used to pattern the target layer 102 (see FIG. 6).

The upper layer 118 is patterned using a photolithography process to form openings 122 therein. To achieve narrow line widths directly in a single patterning process, EUV may be used as a light source in the photolithography process. As an example of patterning openings 122 in the upper layer 118, a photomask (not shown) may be disposed between a radiation beam and the upper layer 118. The upper layer 118 may then be exposed to the radiation beam. In some embodiments, the radiation beam may include an radiation source, such as EUV, an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 118. Exposure of the upper layer 118 may be performed using an immersion lithography system to increase resolution and decrease the minimum achievable pitch. A bake or cure operation may be performed to harden the upper layer 118, and a developer may be used to remove either the exposed or unexposed portions of the upper layer 118 depending on whether a positive or negative resist is used. As an example, the openings 122 may have strip shapes in a three-dimensional perspective view, as shown in FIG. 1A. The pitch of the openings 122 may be the minimum pitch achievable using photolithographic processes alone.

As shown in FIGS. 1A and 1B, portions of unwanted photoresist residue, referred to as scum 150, may remain on portions of the middle layer 116 after development and patterning of the upper layer 118. In some embodiments in which a positive photoresist process is used, the scum 150 may be formed due to a portion of the upper layer 118 not being fully exposed to light (e.g., 50% or less of the expected light dose) in the exposure/development process. In some embodiments in which a negative photoresist process is used, the scum 150 may be formed due to partial exposure of masked portions of the upper layer 118 during the development process. In some embodiments, the scum 150 includes a material comprising remnants of the upper layer 118 from the patterning process, and may include materials such as carbon, hydrogen, oxygen, and/or metals such as antimony, zinc, hafnium, cobalt, palladium, the like, or a combination thereof. The presence of the scum 150 may interfere with subsequent processing steps. For example, regions of the middle layer 116 covered by the scum 150 may not be completely etched during subsequent patterning of the middle layer 116 (see below, FIG. 4), which may result in defects in the semiconductor device 100. A descum process (described below, FIGS. 2A-3) may thus be used to reduce or remove any scum 150 present on the middle layer 116.

Figure 2A:
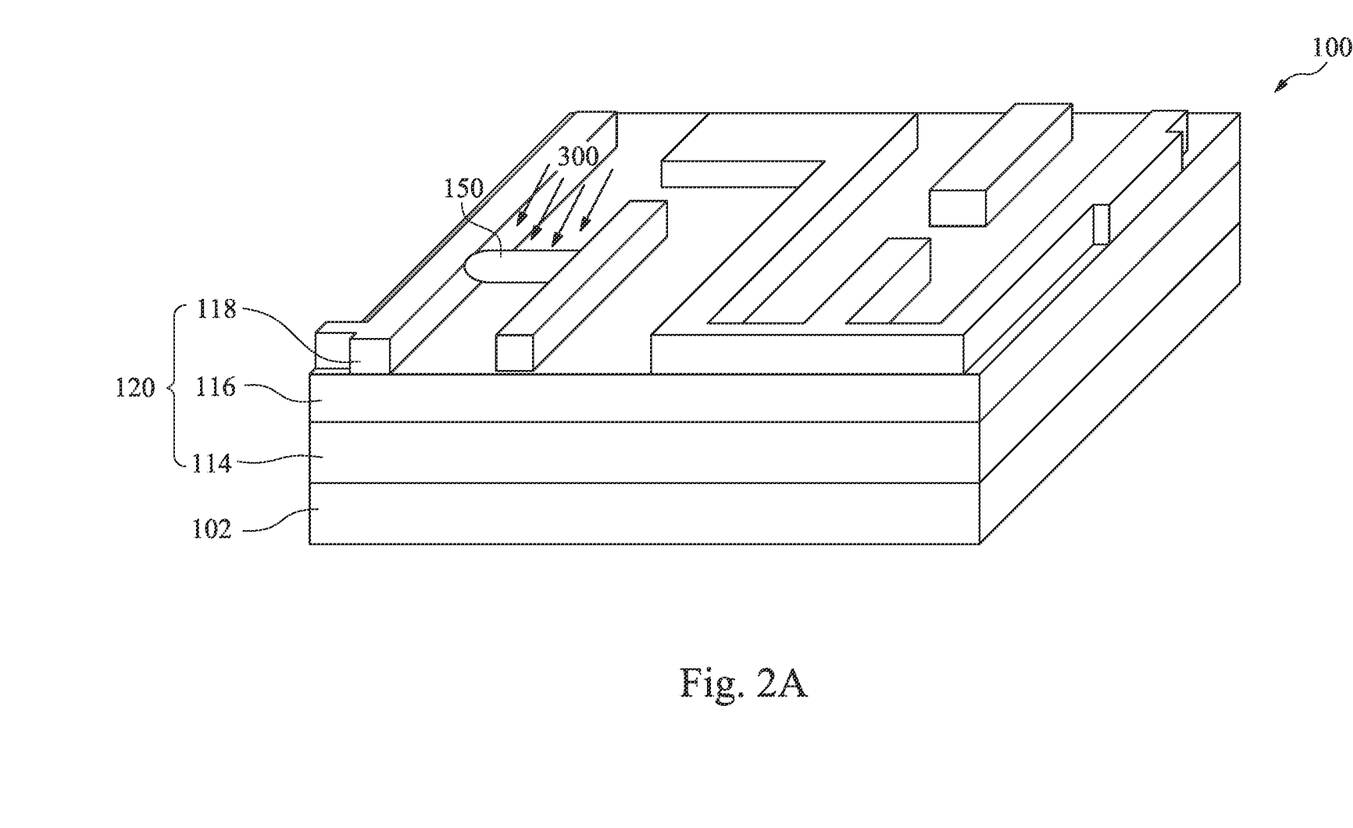
FIG. 2A illustrates a perspective view of an intermediary stage of manufacturing a semiconductor device in accordance with some embodiments.
Figure 2B:
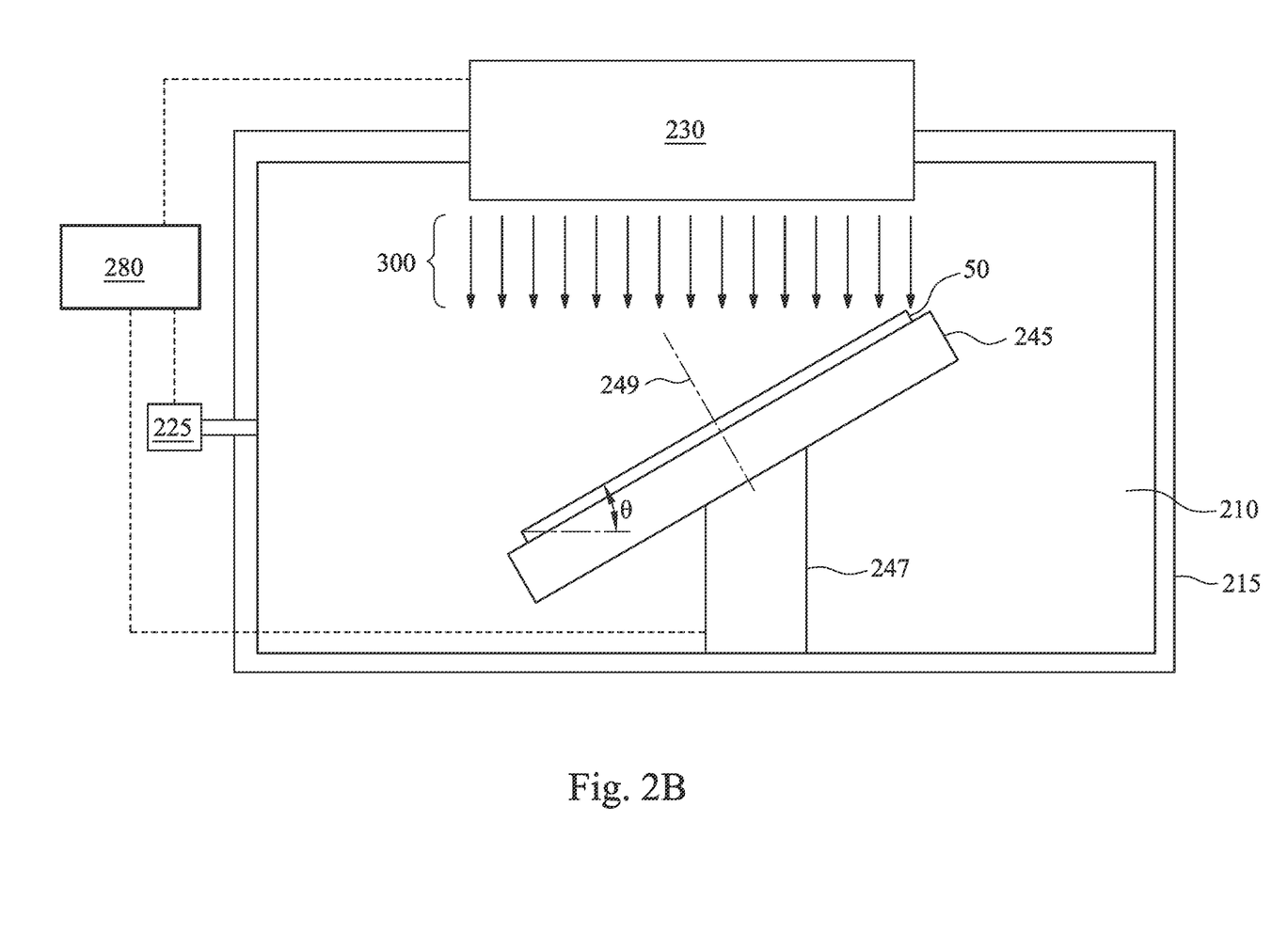
FIG. 2B illustrates a cross-sectional view of a process chamber during an intermediary stage of manufacturing a semiconductor device in accordance with some embodiments.

FIGS. 2A and 2B illustrate an ion treatment 300 to densify and remove the scum 150. The ion treatment 300 implants ions into the scum 150, which may damage atomic bonds in the scum 150 and lead to escape or evaporation of lighter atoms in the scum 150, e.g. hydrogen or oxygen atoms, thereby densifying and removing the scum 150. In some embodiments, such as those in which some scum remains after the ion treatment, this densification of the scum 150 also increases the efficiency of a subsequent etching process 128 (see below, FIG. 3) on the upper layer 118 by, e.g., rendering any remaining scum 150 more susceptible to etchants of the subsequent etching process 128, and reduce loss of material from the upper layer 118. FIG. 2A shows the ion treatment 300 applied to the scum 150 in a perspective view of the semiconductor device 100, and FIG. 2B illustrates a treatment area 210 in which the ion treatment 300 is applied to a wafer 50 on which the semiconductor device 100 is formed.

The treatment area 210 may be a vacuum environment (a vacuum chamber), and may be any desired shape for performing the ion treatment 300 on the wafer 50. Furthermore, the treatment area 210 may be surrounded by a chamber housing 215 made of material that is inert to the various process materials. As such, while the treatment area 210 may be any suitable material that can withstand the chemistries and pressures involved in the ion treatment 300, in an embodiment the treatment area 210 may be steel, stainless steel, nickel, aluminum, alloys of these, combinations of these, and the like.

The treatment area 210 may also be connected to one or more vacuum pumps 225 for exhaust from the treatment area 210. In some embodiments, the vacuum pump 225 is under the control of a controller 280, which may comprise a programmable computer. The controller 280 is illustrated as a single element for illustrative purposes. In some embodiments, the controller 280 comprises multiple elements. The vacuum pump 225 may be utilized to control the pressure within the treatment area 210 to a desired pressure. Additionally, once the ion treatment 300 is completed, the vacuum pump 225 may be utilized to evacuate the treatment area 210 in preparation for removal of the wafer 50.

Within the treatment area 210 is located a mounting platform 245 in order to position and control the wafer 50 during the ion treatment 300. The mounting platform 245 may hold the wafer 50 using a combination of clamps, vacuum pressure, and/or electrostatic forces, and may also include heating and cooling mechanisms in order to control the temperature of the wafer 50 during the ion treatment 300. The mounting platform 245 may be supported by a shaft 247.

Furthermore, while a single wafer 50 on a single mounting platform 245 are illustrated in FIG. 2B, this is merely intended for illustrative purposes and is not intended to be limiting. Rather, any number of mounting platforms 245 may be included and any number of wafers may be included on each mounting platform 245 may be included within the treatment area 210. As such, multiple wafers may be treated simultaneously.

Additionally, the treatment area 210 comprises an ion implantation apparatus 230. In some embodiments, the ion implantation apparatus 230 comprises an accelerator system to accelerate ions of a desired species at a desired dosage concentration. As such, while the precise dosage concentration utilized will depend at least in part on the composition of the scum 150 and the species of ions used, in some embodiments the ion implantation apparatus 230 utilizes an implantation energy in a range of 100 eV to 60 keV along with a dosage concentration of $1\times10^{13}$ atoms/cm$^2$ to $1\times10^{16}$ atoms/cm$^2$.

As illustrated in FIG. 2B, the ion treatment 300 is performed with the wafer 50 at a tilt angle θ from a plane perpendicular to the direction of propagation of the ion treatment 300. In some embodiments, e.g. in accordance with FIG. 2B, the mounting platform 245 is oriented to a tilt angle θ between a top surface of the mounting platform 245 and a plane perpendicular to the direction of the ion treatment 300 in a range of 5° to 85°, such as a range of 45° to 85°. In some embodiments, the mounting platform 245 is oriented to a tilt angle θ between a top surface of the mounting platform 245 and a plane perpendicular to the direction of the ion treatment 300 of at least 45°, such as a tilt angle θ of at least 60°. The tilt angle may be adjusted for a particular application or pattern. For example, a larger tilt angle may result in more of the implant occurring along the sidewalls, and a smaller tilt angle may result in more of the implant occurring on the top surfaces. Performing the ion treatment 300 at the tilt angle θ may remove the scum 150 and increase densification of remnants of the scum 150 (if any) along sidewalls of the scum 150 relative to densification of the top surfaces of the scum 150. In some embodiments, performing the ion treatment 300 at a tilt reduces the number of scum counts to 47% of the scum counts before the ion treatment, and performing the ion treatment 300 at a tilt increased by 20° reduces the number of scum counts to 55% of the scum counts before the ion treatment.

In some embodiments where remnants of the scum 150 remains after the ion treatment 300, because the sidewalls of the scum 150 have larger surface area than the top surfaces of the scum 150, the densification of the sidewalls of remnants of the scum 150 relative to the densification of remnants of top surfaces of the scum 150 may increase the efficiency of a subsequent etching process 128 (see below, FIG. 3), allowing the etching process 128 to use a smaller power (in the case of a dry etch process), a smaller volume of etchants (in the case of a wet etch process), or a shortened etching time due to the greater efficiency provided by the ion treatment 300 while removing less material from the upper layer 118. Furthermore, while the upper surfaces and sidewalls of the upper layer 118 may also be densified during the process, the size of the scum 150 is generally smaller than the size of the pattern of the upper layer 118. Thus, while the upper layer 118 may also be thinned in thickness and width, the larger size of the pattern of the upper layer 118 allows the remnants of the scum 150 to be removed before removal of the pattern of the upper layer 118. The size of the pattern of the upper layer 118 may be slightly increased to account for this thinning.

The tilting of the mounting platform 245 may be performed by, e.g., rotating the mounting platform 245 along an internal axis using a rotor (e.g., located in or connected to the shaft 247) controlled by the controller 280. In some embodiments, the wafer 50 is held in one position on the mounting platform 245 and the tilt angle θ relative to the direction of the ion treatment 300 is controlled by, e.g., rotating the ion implantation apparatus 230 relative to the mounting platform 245. During the ion treatment 300, the mounting platform 245 may be rotated around the tilted axis 249 in a plane parallel to the tilted mounting platform 245. The tilted axis 249 is perpendicular to the top surface of the tilted mounting platform 245. In some embodiments, the mounting platform 245 comprises a mechanism such as a robotic arm that holds the wafer 50 and is rotated to a tilt angle θ between a top surface of the wafer 50 and a plane perpendicular to the direction of the ion treatment 300.

The ion treatment 300 implants the scum 150 using an ion beam with ions of species such as helium, boron, carbon, nitrogen, oxygen, neon, aluminum, silicon, phosphorus, argon, gallium, germanium, arsenic, krypton, indium, tin, antimony, xenon, lead, the like, or a combination thereof. In some embodiments, the pressure in the treatment area 210 during the ion treatment 300 is in a range of $1\times10^{-7}$ torr to $1\times10^{-2}$ torr. In some embodiments, the temperature in the treatment area 210 during the ion treatment 300 is in a range of −273° C. to 500° C., such as a range of −273° C. to 30° C.

Figure 3:
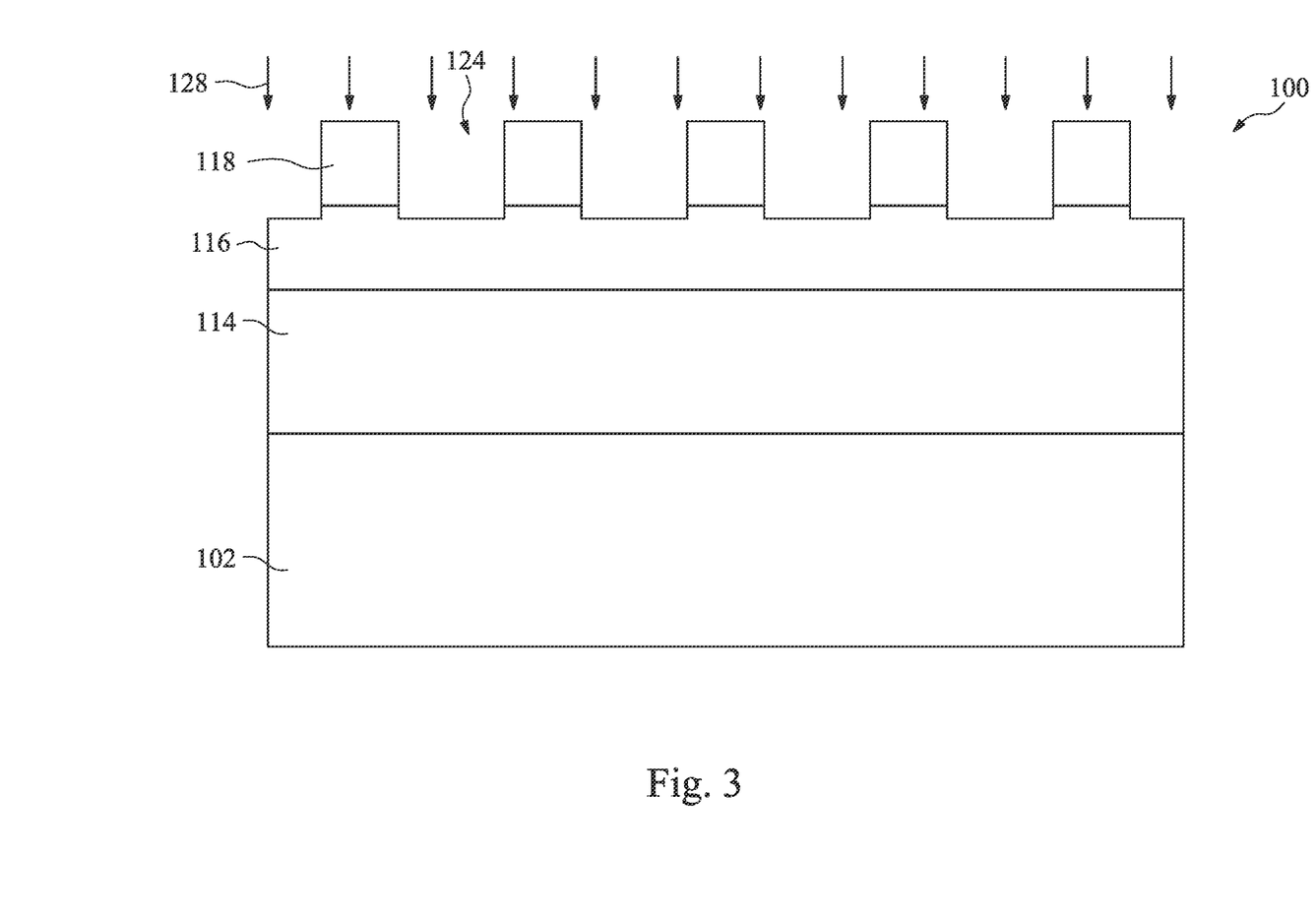
FIGS. 3-7 illustrate cross-sectional views of various intermediary stages of manufacturing a semiconductor device in accordance with some embodiments.

FIG. 3 illustrates an etching process 128 on the semiconductor device 100 after the ion treatment 300, as shown in a cross-sectional view of FIG. 1A along line A-A'. In some embodiments, remnants of the scum 150 remain after the ion treatment 300. The etching process 128 may remove the remnants of the scum 150 prior to performing an etching process to transfer the pattern of the upper layer 118 to the middle layer 116 (see below, FIG. 4). In some embodiments, the ion treatment 300 removes the scum 150 and the pattern of the upper layer 118 is transferred to the middle layer 116 without performing the etching process 128.

The etching process 128 removes remnants of the densified scum 150 and uniformly removes a small amount of material from the exposed parts of the upper layer 118 and middle layer 116. Because the remnants of the densified scum 150 have a much smaller volume than the volume of the upper layer 118, the remnants of the densified scum 150 may be removed while removing only a small amount of material from the exposed parts of the upper layer 118 and middle layer 116. The etching process 128 provides vertical resist profiles of the upper layer 118 and removes residue of the upper layer 118 which remain in openings 122 after patterning. In some embodiments, the tilt angle may be adjusted to densify the sidewalls of the scum 150 more than top surfaces of the scum 150. As a result the etching process 128 removes the remnants of the scum 150 more efficiently due to the larger surface area of the sidewalls of the scum 150 relative to the top surface of the scum 150. Thus, the etching process 128 may use a smaller power (in the case of a dry etching process), a smaller volume of etchants (in the case of a wet etching process), or a shortened etching time due to the greater efficiency provided by the ion treatment 300. Due to the improved efficiency of the etching process 128, less material from the upper layer 118 is removed by the etching process 128. For example, an increase of the tilt angle θ of the ion treatment 300 from 0° to 60° may reduce an amount lost from the upper layer 118 during the etching process 128 by 18%.

The etching process 128 may use a wet or dry etch process to facilitate the removal of material of the upper layer 118 and middle layer 116. Suitable chemical etchants for a wet etching process include tetramethylammonium hydroxide (TMAH), sulfuric acid ($H_2SO_4$), potassium hydroxide (KOH), boron hydroxide (BOH), other suitable acids or hydroxides, or combinations thereof. Suitable process gasses for a dry etching process, e.g. a chemical plasma etch, include oxygen, a fluorine containing gas, a chlorine containing gas, an $O_2$ based gas, or combinations thereof. The etching process 128 may comprise one or more process steps. As a result of the etching process 128, openings 122 are enlarged into openings 124.

Figure 4:
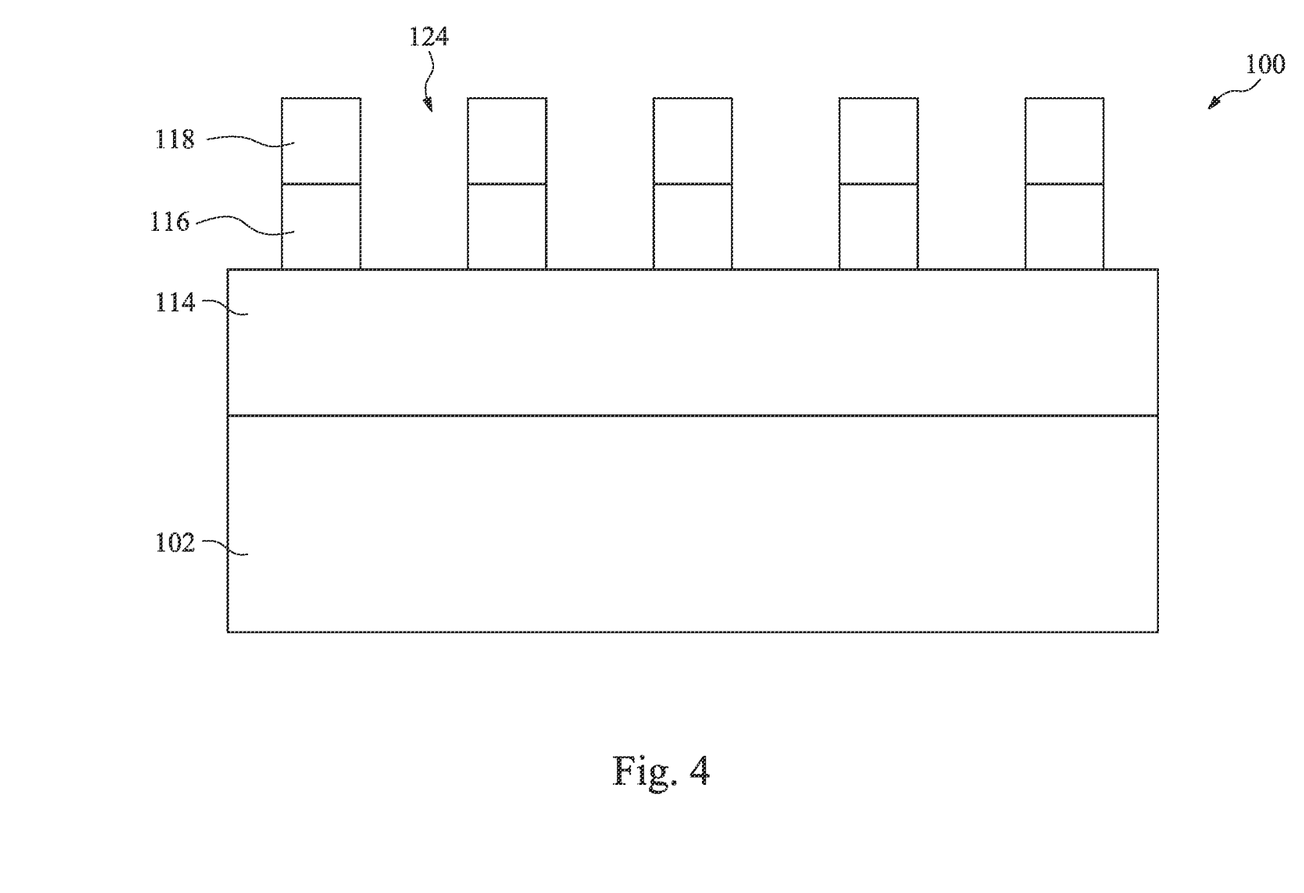

FIG. 4 illustrates the transferring of the pattern of the upper layer 118 to the middle layer 116 in an etching process performed after the patterning of the upper layer 118 and the ion treatment 300. The etching process may be anisotropic, so that the openings 124 are extended through the middle layer 116 and have about the same sizes in the middle layer 116 as in the overlying layer, within process variations. Because the ion treatment 300 and the etching process 128 remove the remnants of the scum 150 more efficiently while removing less material from the upper layer 118, the pattern of the upper layer 118 is transferred to the middle layer 116 by the etching process with fewer defects. The pattern of the middle layer 116 having fewer defects may lead to reduced roughness of the sidewalls of the openings 124 and improved subsequent transfer of the pattern to lower layers, which may reduce LWR of subsequently formed conductive features in the target layer 102.

Figure 5:
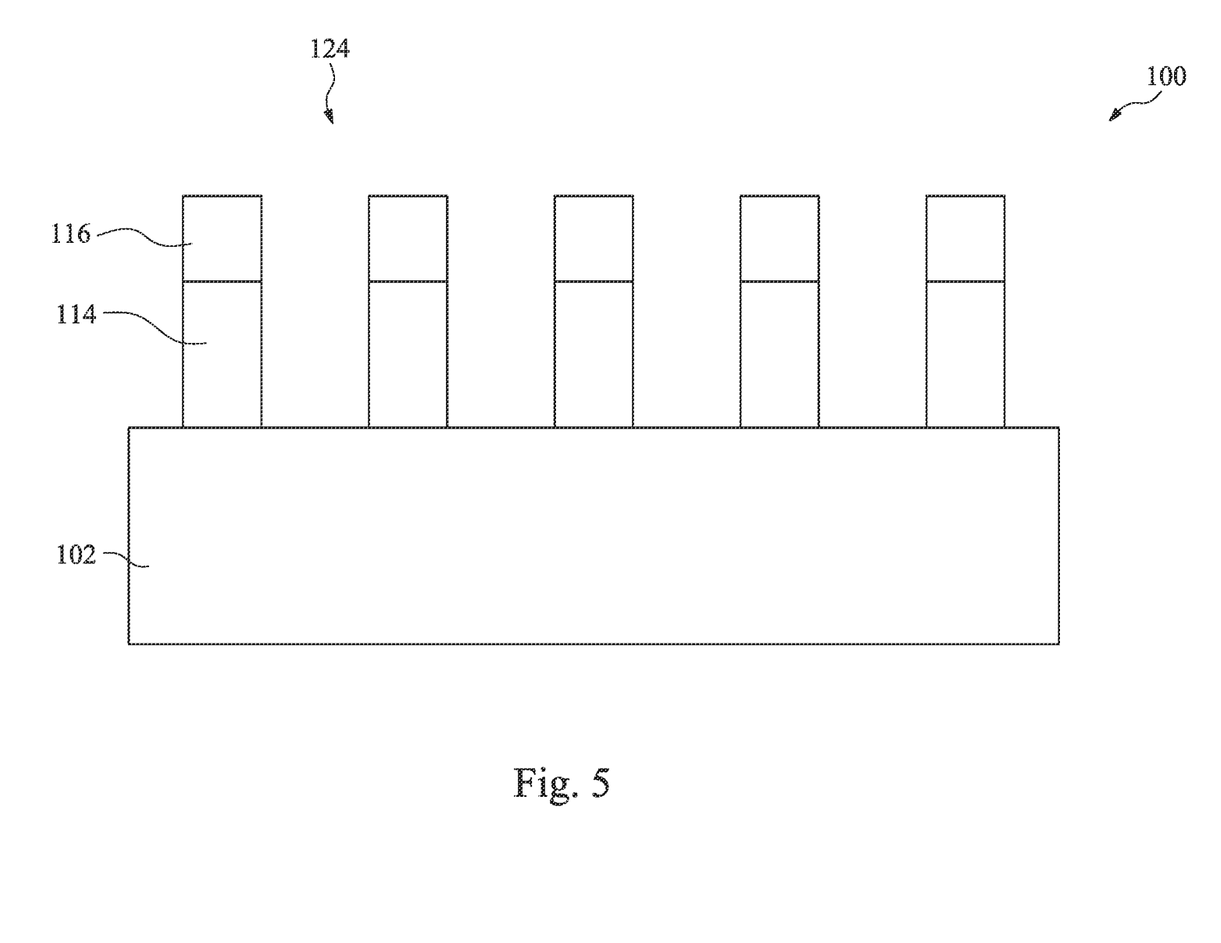

In FIG. 5, an etching process is performed to transfer the pattern of the middle layer 116 to the bottom layer 114, thereby extending the openings 124 through the bottom layer 114. The etching process of the bottom layer 114 may be anisotropic, so that the openings 124 in the middle layer 116 are extended through the bottom layer 114 and have about the same sizes in the bottom layer 114 as in the middle layer 116, within process variations. Because the ion treatment 300 and etching process 128 remove the scum 150 more efficiently while removing less material from the upper layer 118, the pattern of the upper layer 118 is transferred to the middle layer 116 by the etching process with fewer defects and the pattern of the middle layer 116 is transferred to the bottom layer 114 with fewer defects. The pattern of the bottom layer 114 having fewer defects may lead to improved subsequent transfer of the pattern to lower layers, which may reduce LWR of subsequently formed conductive features in the target layer 102. As part of etching the bottom layer 114, remaining portions of the upper layer 118 may be consumed. In some embodiments, remaining portions of the upper layer 118 are removed by a separate process prior to or after the etching of the bottom layer 114.

Figure 6:
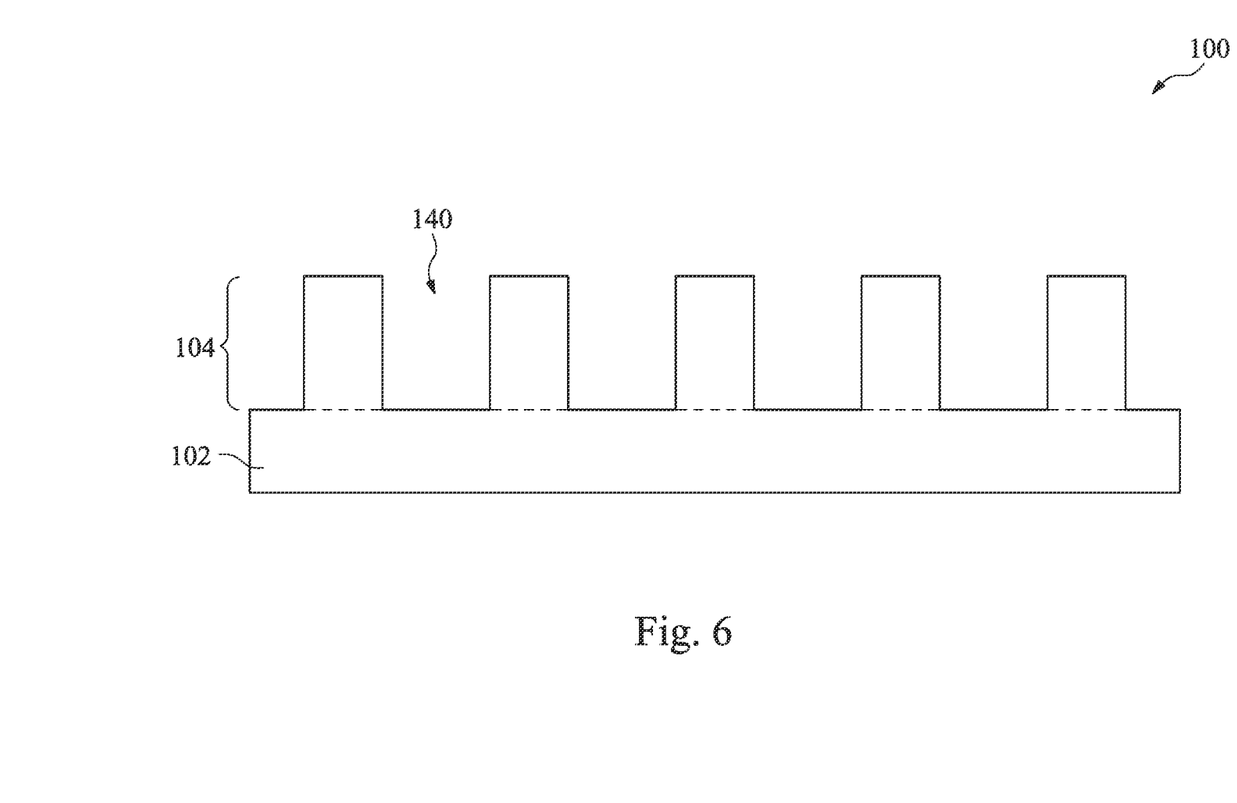

In FIG. 6, the pattern of the bottom layer 114 is transferred to the target layer 102 using an etching process, forming recesses 140 in the target layer 102. In some embodiments, the recesses 140 extend partially into the target layer 102, forming patterned portions 104 interposed between the recesses 140. In some embodiments, the recesses 140 extend through the target layer 102 to a substrate or an underlying layer (not illustrated) below the target layer 102.

The etching process of the target layer 102 may be anisotropic, so that the openings 124 in the bottom layer 114 (see above, FIG. 5) are extended into the target layer 102, and so that the recesses 140 have about the same sizes in the target layer 102 as the openings 124 in the bottom layer 114, within process variations. Because the ion treatment 300 and etching process 128 remove the scum 150 more efficiently while removing less material from the upper layer 118, the pattern of the upper layer 118 is transferred to the middle layer 116 by the etching process with fewer defects and the pattern of the middle layer 116 is transferred to the bottom layer 114 with fewer defects. As the pattern of the bottom layer 114 has reduced defects, the transfer of the pattern to the target layer 102 may produce fewer defects and lead to reduced roughness of the sidewalls of the recesses 140, which may further lead to fewer defects in subsequently formed conductive features in the target layer 102. During etching of the target layer 102, the middle layer 116 may be consumed, and the bottom layer 114 may be at least partially consumed. In embodiments when the bottom layer 114 is not completely consumed while etching the target layer 102, an ashing process may be performed to remove remaining residue of the bottom layer 114.

Figure 7:
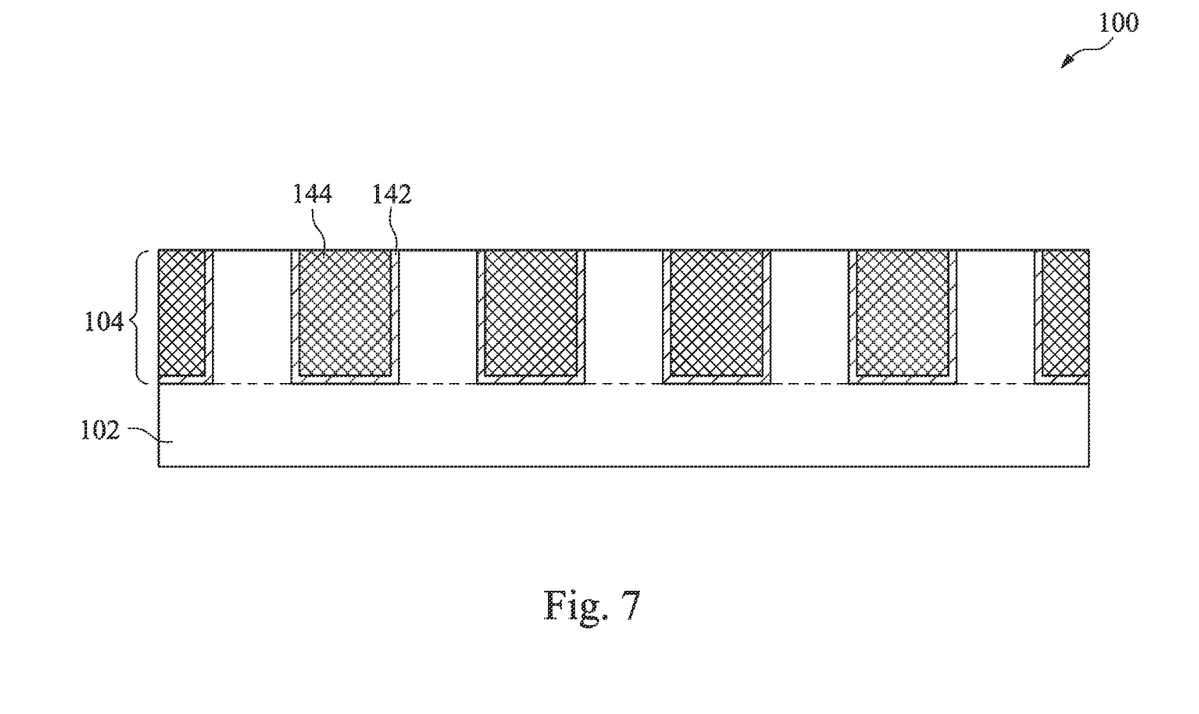

In FIG. 7, after the recesses 140 are patterned in the target layer 102, features may be formed in the recesses 140. In some embodiments, the target layer 102 is a low-k dielectric, and the patterned layer 104 provides an IMD for an interconnect structure. Conductive features such as copper lines, copper vias, and/or cobalt plugs may be formed in the IMD layer. Forming the conductive features may include depositing one or more liners 142 along sidewalls and a bottom surface of the recesses 140. The liners 142 may comprise TiO, TiN, TaO, TaN, or the like and may provide diffusion barrier, adhesion, and/or seed layers for the conductive feature. The liners may be deposited using any suitable process, such as PVD, CVD, ALD, and the like.

After the liners 142 are deposited, remaining portions of the recesses 140 may be filled with a conductive material 144, such as copper using, e.g., PVD, plating, or the like. The conductive material 144 may be initially deposited to overfill the recesses 140 (see above, FIG. 6), and a planarization process performed to remove excess portions of the conductive material 144 over the patterned layer 104. Thus, conductive features may be formed between portions of the patterned layer 104. The conductive features may have reduced defects and smoother profiles because the ion treatment 300 and the etching process 128 remove the scum 150 more efficiently while removing less material from the upper layer 118, leading to the pattern of the upper layer 118 being transferred more cleanly to the patterned layer 104.

The conductive features of the conductive material 144 having reduced defects and smoother profiles may decrease sheet resistance and thus improve device performance.

Figure 8:
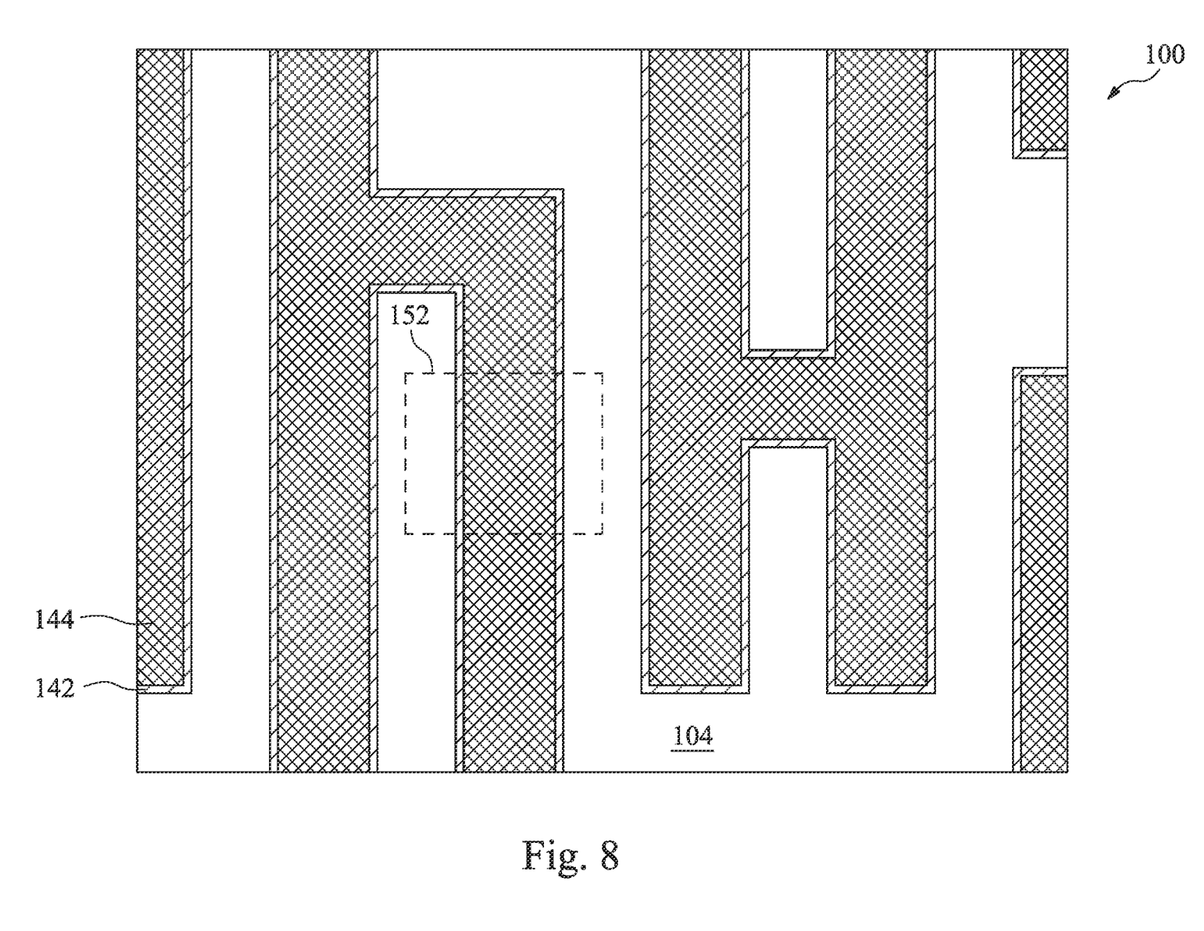
FIG. 8 illustrates a top down view of an intermediary stage of manufacturing a semiconductor device in accordance with some embodiments.

FIG. 8 illustrates a top down view of the semiconductor device 100 after the features have been formed in the patterned layer 104, in accordance with some embodiments. FIG. 8 is a partial view of a pattern of conductive material 144 surrounded by the patterned layer 104. Liners 142 may be between the patterned layer 104 and the conductive material 144. The conductive features of the conductive material 144 may have reduced defects and smoother sidewalls due to the ion treatment 300 and the etching process 128 removing the scum 150 more efficiently while removing less material from the upper layer 118. For example, removing the scum 150 in region 152 (around the former position of the scum 150 removed in FIG. 3) may reduce or prevent a break in a conductive line formed by the conductive material 144 in the region 152 while producing smoother sidewalls of the conductive line by not removing too much material from the upper layer 118.

Embodiments may provide advantages. Ion treatments to reduce or remove scum on a patterned mask layer are performed at an angle to a surface of the patterned mask layer. By densifying and removing scum on the patterned mask layer, the ion treatment may reduce loss of material from the patterned mask layer during a subsequent etching process on the patterned mask layer and increase efficiency of the etching process. The ion treatment may reduce defects in a transfer of the pattern of the patterned mask layer to lower layers. This may produce smoother profiles of subsequently formed conductive features in a target layer, which can decrease sheet resistance and thus improve device performance.

In accordance with an embodiment, a method of forming a semiconductor device includes: forming a photoresist over a target layer, the target layer including a substrate; patterning the photoresist to form a patterned photoresist, where scum remains between portions of the patterned photoresist; tilting the substrate relative to a direction of propagation of an ion beam; performing an ion treatment on the scum; and transferring a pattern of the patterned photoresist to the target layer. In an embodiment, the method further includes performing a dry etch after performing the ion treatment, the dry etch removing remnants of the scum. In an embodiment, the substrate is tilted by at least 60° relative to a plane perpendicular to the direction of propagation of the ion beam. In an embodiment, performing the ion treatment further includes rotating the tilted substrate in a plane parallel to the tilted substrate. In an embodiment, the ion treatment densifies a sidewall of the scum. In an embodiment, the scum includes carbon, hydrogen, oxygen, antimony, zinc, hafnium, cobalt, palladium, or a combination thereof. In an embodiment, the ion treatment includes implanting species of helium, boron, carbon, nitrogen, oxygen, neon, aluminum, silicon, phosphorus, argons, gallium, germanium, arsenic, krypton, indium, tin, antimony, xenon, lead, or a combination thereof.

In accordance with another embodiment, a method of forming a semiconductor device includes: patterning a photoresist on a wafer, the wafer including a target layer, patterning the photoresist leaving residue on the target layer; implanting the residue with ions, where the ions propagate in a first direction during implanting, an angle between a plane perpendicular to the first direction and a bottom surface of the wafer being 45° or greater; and transferring a pattern of the photoresist to the target layer to form a patterned target layer. In an embodiment, the method further includes performing a plasma etch, where the plasma etch removes material from sidewalls of the residue at a faster rate than the plasma etch removes material from a top surface of the residue. In an embodiment, the ions are implanted with an implantation energy in a range of 100 eV to 60 keV. In an embodiment, the ions are implanted with a dosage concentration in a range of $1\times10^{13}$ atoms/cm$^2$ to $1\times10^{16}$ atoms/cm$^2$. In an embodiment, the ions include helium, boron, carbon, nitrogen, oxygen, neon, aluminum, silicon, phosphorus, argons, gallium, germanium, arsenic, krypton, indium, tin, antimony, xenon, lead, or a combination thereof. In an embodiment, the implanting is performed under a pressure in a range of $1\times10^{-7}$ torr to $1\times10^{-2}$ torr. In an embodiment, the target layer is an inter-metal dielectric layer. In an embodiment, the method further includes filling recesses in the patterned target layer with a conductive material.

In accordance with yet another embodiment, a method of forming a semiconductor device includes: forming a photoresist over a target layer, the target layer being over a substrate; patterning the photoresist, where scum remains between portions of the photoresist after patterning the photoresist; tilting the substrate by an angle in a range of 45° to 85°; performing an ion implantation on the scum; patterning the target layer using the patterned photoresist as a mask to form openings in the target layer; and forming conductive features in the openings. In an embodiment, the method further includes: after performing the ion implantation, removing remnants of the scum with an etch process. In an embodiment, the etch process removes the scum at a faster rate than the etch process removes material from a top surface of the photoresist. In an embodiment, the etch process is a chemical plasma etch. In an embodiment, the etch process is a wet etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a photoresist over a target layer, the target layer comprising a substrate;
   patterning the photoresist to form a patterned photoresist, wherein scum remains between portions of the patterned photoresist;
   tilting the substrate relative to a direction of propagation of an ion beam;
   performing an ion treatment on the scum;
   after performing the ion treatment, performing a dry etch to remove remnants of the scum; and
   after the dry etch, transferring a pattern of the patterned photoresist to the target layer.

2. The method of claim 1, wherein the substrate is tilted by at least 60° relative to a plane perpendicular to the direction of propagation of the ion beam.

3. The method of claim 1, wherein performing the ion treatment further comprises rotating the tilted substrate in a plane parallel to the tilted substrate.

4. The method of claim 1, wherein the scum comprises carbon, hydrogen, oxygen, antimony, zinc, hafnium, cobalt, palladium, or a combination thereof.

5. The method of claim 1, wherein the ion treatment comprises implanting species of helium, boron, carbon, nitrogen, oxygen, neon, aluminum, silicon, phosphorus, argons, gallium, germanium, arsenic, krypton, indium, tin, antimony, xenon, lead, or a combination thereof.

6. The method of claim 1, wherein when patterning the photoresist, a thickness and a width of the patterned photoresist are increased to account for thinning of the thickness and the width of the patterned photoresist by the dry etch.

7. The method of claim 1, wherein the ion treatment is configured to break atomic bonds to make hydrogen or oxygen atoms of the scum escape to densify the scum.

8. A method comprising:
   patterning a photoresist on a wafer, the wafer comprising a target layer, patterning the photoresist leaving residue on the target layer;
   implanting the residue with ions, wherein the ions propagate in a first direction during implanting, an angle between a plane perpendicular to the first direction and a bottom surface of the wafer being 45° or greater;
   after implanting the residue with the ions, performing a plasma etch to remove the residue; and
   after the plasma etch, transferring a pattern of the photoresist to the target layer to form a patterned target layer.

9. The method of claim 8, wherein the ions are implanted with an implantation energy in a range of 100 eV to 60 keV.

10. The method of claim 8, wherein the ions are implanted with a dosage concentration in a range of $1\times10^{13}$ atoms/cm$^2$ to $1\times10^{16}$ atoms/cm$^2$.

11. The method of claim 8, wherein the ions comprise helium, boron, carbon, nitrogen, oxygen, neon, aluminum, silicon, phosphorus, argons, gallium, germanium, arsenic, krypton, indium, tin, antimony, xenon, lead, or a combination thereof.

12. The method of claim 8, wherein the implanting is performed under a pressure in a range of $1\times10^{-7}$ torr to $1\times10^{-2}$ torr.

13. The method of claim 8, wherein when patterning the photoresist, a thickness and a width of the patterned photoresist are increased to account for thinning of the thickness and the width of the patterned photoresist by the plasma etch.

14. The method of claim 8, wherein the target layer is an inter-metal dielectric layer.

15. The method of claim 14, further comprising filling recesses in the patterned target layer with a conductive material.

16. A method comprising:
   forming a photoresist over a target layer, the target layer being over a substrate;
   patterning the photoresist, wherein scum remains between portions of the photoresist after patterning the photoresist;
   tilting the substrate by an angle in a range of 45° to 85°;
   performing an ion implantation on the scum;
   after performing the ion implantation, performing an etch process to remove remnants of the scum;
   after performing the etch process, patterning the target layer using the patterned photoresist as a mask to form openings in the target layer; and
   forming conductive features in the openings.

17. The method of claim 16, wherein the etch process removes the scum at a faster rate than the etch process removes material from of the patterned photoresist.

18. The method of claim 16, wherein the etch process is a chemical plasma etch.

19. The method of claim 16, wherein the etch process is a wet etch.

20. The method of claim 16, wherein when patterning the photoresist, a thickness and a width of the patterned photoresist are increased to account for thinning of the thickness and the width the patterned photoresist by the etch process.

* * * * *